US009342635B2

(12) United States Patent
Perez Garraleta

(10) Patent No.: US 9,342,635 B2
(45) Date of Patent: May 17, 2016

(54) METHOD FOR PREDICTING THE IMPACT ON AN AIRCRAFT OF DEBRIS SHED OFF FROM IT

(75) Inventor: Juan Ramon Perez Garraleta, Madrid (ES)

(73) Assignee: AIRBUS OPERATIONS S.L., Madrid (ES)

( * ) Notice: Subject to any disclaimer, the term of this patent is extended or adjusted under 35 U.S.C. 154(b) by 423 days.

(21) Appl. No.: 13/349,974

(22) Filed: Jan. 13, 2012

(65) Prior Publication Data

US 2013/0060538 A1     Mar. 7, 2013

(30) Foreign Application Priority Data

Sep. 6, 2011   (ES) .................................. 201131463

(51) Int. Cl.
*G06F 7/60*       (2006.01)
*G06F 17/10*      (2006.01)
*G06F 17/50*      (2006.01)

(52) U.S. Cl.
CPC ........ *G06F 17/5009* (2013.01); *G06F 17/5095* (2013.01)

(58) Field of Classification Search
None
See application file for complete search history.

(56) References Cited

U.S. PATENT DOCUMENTS

2013/0062472 A1*   3/2013   Stokes ...................... 244/171.7

OTHER PUBLICATIONS

Lin et al., Determination of Debris Risk to the Public Due to the Columbia Breakup During Reentry, ACTA Inc., Oct. 2003, vol. 11 Appendix D. 16, pp. 471-508.*
Murman et al., Characterization of Space Shuttle Ascent Debris Aerodynamics Using CFD Methods, American Institute of Aeronautics and Astronautics, Jan. 2005, pp. 1-20.*
Columbia Sacrifice, Columbia's Breakup and Debris Field with Debris Trajectory, Columbia Sacrifice, pp. 1-14.*
Robledo, Analysis and Integration of a Debris Model in the Virtual Range Project, 2004, University of Central Florida, pp. 1-120.*
Seng et al., Uncontained Engine Debris Analysis Using the Uncontained Engine Debris Damage Assessment Model, Sep. 2004, U.S. Department of Transportation, pp. 1-75.*
Deters et al., A Retrospective: Development of Simulation Models for the 1903 and 1905 Wright Flyers, 2004, American Institute of Aeronautics and Astronautics Paper, pp. 1-12.*
Federal Aviation Administration (FAA), Expected Casualty Calculations for Commerical Space Launch and Reentry Missions, Aug. 30, 2000, US Department of Transportation, pp. 1-25.*

* cited by examiner

*Primary Examiner* — Saif Alhija
*Assistant Examiner* — Bernard E Cothran
(74) *Attorney, Agent, or Firm* — Oblon, McClelland, Maier & Neustadt, L.L.P.

(57) ABSTRACT

Computer-aided method to predict the location of an impact on an aircraft of debris shed off from the own aircraft comprising the following steps: a) providing the nominal position on the aircraft of said debris before its detachment; b) represent the debris by a body of a size and density appropriate to its characteristics; c) calculating a predetermined number of trajectories in three dimensions of said body in a predetermined fluid field when it is detached from the aircraft using an analytical model for calculating said trajectories and randomly varying one or more of the following initial conditions: the initial position of the body; the dimensions of the body; the damping coefficients of the angular velocity; the initial angles of roll, pitch and yaw; d) calculating the points of impact of said trajectories in the aircraft.

13 Claims, 3 Drawing Sheets

METHOD FOR PREDICTING THE IMPACT ON AN AIRCRAFT OF DEBRIS SHED OFF FROM IT

FIELD OF THE INVENTION

The present invention relates to a method for predicting the impact on an aircraft of debris shed off from it.

BACKGROUND OF THE INVENTION

As is well known from the surface of an aircraft can be shed off different pieces of material (plates, pieces of ice, covers . . . ) who pose a risk when they hit other parts of the surface of the aircraft. In fact several catastrophic accidents are known due to the impact of debris shed off from the own aircraft.

These risks are especially important in aircrafts fitted with open rotor propulsion engines in the rear part in which events can happen where a blade of one of the propeller engines comes off and hits the fuselage, where a part of the rotor of the engine brakes, it is released and hits the fuselage, or where an ice shedding created in the tips of the blades can be thrown at high speed over the fuselage.

The design of these aircraft must therefore take account of these events and ensure their ability to maintain stability and carry out a safe landing of the aircraft, being for that very important to predict the possible trajectories.

While there are known wind tunnel tests designed to predict aircraft zones affected by specific pieces detached from the aircraft it is not known any computer-aided method to predict areas affected by impacts of debris shed off from the aircraft.

The present invention is directed to solving this problem.

SUMMARY OF THE INVENTION

An object of this invention to provide a computer-aided method to predict the location of an impact of an aircraft of debris shed off from it.

In one aspect, this and other objects are achieved by a method comprising the following steps:

a) providing the nominal position on the aircraft of said debris before its detachment;

b) represent the debris by a body of a size and density appropriate to its characteristics;

c) calculating a predetermined number of trajectories in three dimensions of said body in a predetermined fluid field when it is detached from the aircraft using an analytical model for calculating said trajectories which comprises equations of motion of said body resulting from the aerodynamic forces and moments acting on it and including one or more damping coefficients of its angular velocity, and randomly varying one or more of the following initial conditions: the initial position of the body within a predetermined space around said nominal position; the dimensions of the body within a set of predetermined values, the damping coefficients of the angular velocity within a predetermined set of values, the initial angles of roll, pitch and yaw within a predetermined range of values;

d) calculating the points of impact of said trajectories in the aircraft.

In embodiments of the method the velocity of the body at the time of impact is also calculated. Hereby it is achieved a method that provides a basic information for the design of those parts of the aircraft affected by potential impacts of debris shed off from the aircraft.

In embodiments of the method, the body is a flat plate. Hereby it is achieved a method which, on the one hand, is adapted to the nature of the debris shed off from an aircraft and, on the other hand, can take advantage of available knowledge about the dynamics of flat plates in a fluid medium, and particularly on aerodynamic models (like the ESDU or Hoerner) that apply to them.

In embodiments of the method, the range of the departure angle of the debris with respect to any of the three coordinate axes is comprised between −90° and +90°. Hereby it is achieved a method adapted to the nature of the problem given that the angle of departure is an important variable for calculating the possible trajectories of the debris.

In embodiments of the method, the fluid field in which occurs the detachment of the debris from the aircraft can be an uniform fluid field of a predetermined speed (if a simplification of the problem is wanted or if previous analysis to refine the method shall be done) or a real fluid field.

In another aspect, the above mentioned objects are achieved by a computer program adapted to execute the above-mentioned method.

In embodiments of the computer program, each of said trajectories is obtained as a collection of points identified by its coordinates. Hereby it is achieved a computer program that provides said trajectories in an optimum format to calculate their impacts on the surface of the aircraft.

In embodiments of the computer program, a surface representation of the aircraft on triangular meshes is used to calculate the impact of said trajectories on the aircraft. Hereby it is achieved a very efficient computer program for calculating said impacts on the surface of the aircraft.

Other features and advantages of the present invention will become apparent from the following detailed description of embodiments illustrative of its object, along with the accompanying figures.

DETAILED DESCRIPTION OF THE INVENTION

EI Analytical Model Used for the Calculation of the Trajectories

Figure 1:
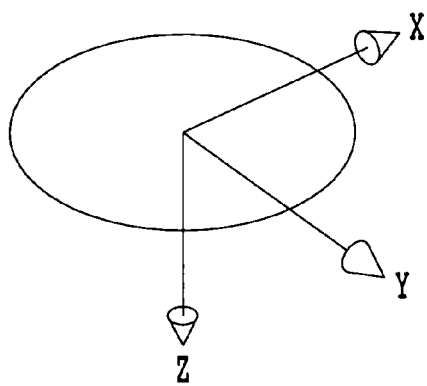
FIGS. 1 and 2 illustrate the reference systems used in the analytical model to calculate trajectories used in the method of the present invention.
Figure 2:
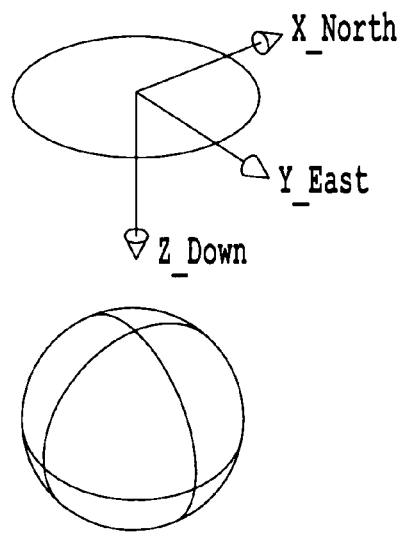

Reference coordinates system: The body axis and the earth axis shown respectively in FIGS. 1 and 2.

Nomenclature Used:

m Mass of the object.
g Gravity constant.
$C_N$ Normal force coefficient.
$C_{DD1}$, $C_{DD2}$, $C_{DD3}$ Damping coefficients of rotation.
d Characteristic dimension.
ρ Density of air.

$$\begin{pmatrix} I_{XX} & I_{XY} & I_{XZ} \\ I_{YX} & I_{YY} & I_{YZ} \\ I_{ZX} & I_{ZY} & I_{ZZ} \end{pmatrix} \text{Inertia Matrix.}$$

Variables in Earth Axis:
$X_W, Y_W, Z_W$ Position of gravity center.
$U_W, V_W, W_W$ Linear velocity.
$\phi, \theta, \psi$ Orientation Pitch (X), Roll (Y), Yaw (Z). They are applied in this order: Yaw, Roll, Pitch.
$V_{XT}, V_{YT}, V_{ZT}$ Speed of air.
Variables in Body Axis:
U,V,W Linear velocity.
U',V',W' Linear acceleration.
$V_{XA}, V_{YA}, V_{ZA}$ Velocity of air.
$F_X, F_Y, F_Z$ Aerodynamic forces.
L,M,N Aerodynamic moments.
P,Q,R Angular velocity.
P',Q',R' Angular acceleration.
$X_{CP}, Y_{CP}$ Pressure center coordinates.
Equations in Body Axis:
Force Equations:

$$F_X = m(U' - VR + g \sin \theta)$$

$$F_Y = m(V' - WP + UR - g \sin \phi \cos \theta)$$

$$F_Z = m(W' - UQ + VP - g \cos \phi \cos \theta)$$

Moment Equations:

$$L = I_{XX} P' - I_{XZ} R' - I_{XZ} PQ + (I_{ZZ} - I_{YY}) RQ$$

$$M = I_{YY} Q' + (I_{XX} - I_{ZZ}) PR + I_{XZ}(P^2 - R^2)$$

$$N = I_{ZZ} R' - I_{XZ} P' + (I_{YY} - I_{XX}) PQ - I_{XZ} QR$$

Aerodynamic Forces:
$F_X = 0$
$F_Y = 0$ $$F_N = C_N \frac{1}{2} \rho V_T^2 S$$

Aerodynamic Moments:

$$L = (C_N Y_{CP})\frac{\rho V_T^2 S}{2} + C_{DD1} P + C_{DD2} P^2 + \left(C_{DD3} P \frac{d}{2V_T}\right)\frac{\rho V_T^2 S d}{2}$$

$$M = (-C_N X_{CP})\frac{\rho V_T^2 S}{2} + C_{DD1} Q + C_{DD2} Q^2 + \left(C_{DD3} Q \frac{d}{2V_T}\right)\frac{\rho V_T^2 S d}{2}$$

N=0
Simplifying:

$$L = \frac{1}{2} C_N Y_{CP} \rho V_T^2 S + C_{DD1} P + C_{DD2} P^2 + \frac{1}{4} \rho C_{DD3} P d^2 V_T S$$

$$M = \frac{1}{2} C_N X_{CP} \rho V_T^2 S + C_{DD1} Q + C_{DD2} Q^2 + \frac{1}{4} \rho C_{DD3} Q d^2 V_T S$$

N=0

In these equations have been included terms that contribute to the damping of the angular velocity with three damping coefficients $C_{DD1}$, $C_{DD2}$ and $C_{DD3}$ that can be used or not depending on the circumstances of each case.

The term $C_{DD1} Q$, has been used in some studies about ice-shedding such as for example: AIAA 2001-0680 (Analytical Prediction of Trajectories of Ice Pieces after Release in an Airstream), but there is not any reference to the origin of this terms. The dimensions of $C_{DD1}$ are $[M \cdot L^2 \cdot T^{-1}]$.

EI term $C_{DD2} Q^2$ results from the integration of the drag forces actuating on a rotating plate. The dimensions of $C_{DD2}$ are: $[M \cdot L^2]$ The term $$\frac{1}{4} \rho C_{DD3} P \cdot d^2 V_T S,$$

is the one commonly used in the aircraft flight dynamics. The coefficient $C_{DD3}$ (Roll damping) is a dimensional. It has the drawback that when that does not operate when the translational velocity is zero; which means that if a flat plate only rolls will never stop.

Dynamic Equations:

$$U' = VR - WQ - g\text{SIN}(\theta) + \frac{F_X}{m}$$

$$V' = WP - UR + g\text{SIN}(\phi)\text{COS}(\theta) + \frac{F_Y}{m}$$

$$W' = UQ - VP + g\text{COS}(\phi)\text{COS}(\theta) + \frac{F_Z}{m}$$

$$P' = \frac{((L + I_{XZ}PQ - (I_{ZZ} - I_{YY})RQ)I_{ZZ} - (N - (I_{YY} - I_{XX})PQ - I_{XZ}RQ)I_{XZ})}{(I_{XX} I_{ZZ} - I_{XZ}^2)}$$

$$Q' = \frac{(M - (I_{XX} - I_{ZZ})PR - (P^2 - R^2)I_{XZ})}{I_{YY}}$$

$$R' = \frac{((N - (I_{YY} - I_{XX})PQ - I_{XZ}RQ)I_{XX} + (L + I_{XZ}PQ - (I_{ZZ} - I_{YY})RQ)I_{XZ})}{(I_{XX} I_{ZZ} - I_{XZ}^2)}$$

$$\theta' = Q \text{COS}(\phi) - R \text{SIN}(\phi)$$

$$\phi' = P + (Q \text{SIN}(\phi) - R \text{COS}(\phi))\text{TAN}(\theta)$$

$$\psi' = \frac{Q\text{SIN}(\phi) + R\text{COS}(\phi)}{\text{COS}(\theta)}$$

Wind Velocity in the Body Axis:

$$\begin{pmatrix} V_{XA} \\ V_{YA} \\ V_{ZA} \end{pmatrix} = \begin{pmatrix} V_{XT} \\ V_{YT} \\ V_{ZT} \end{pmatrix} \cdot \begin{pmatrix} \text{COS}(\psi) & \text{SIN}(\psi) & 0 \\ -\text{SIN}(\psi) & \text{COS}(\psi) & 0 \\ 0 & 0 & 1 \end{pmatrix} \cdot$$

$$\begin{pmatrix} \text{COS}(\theta) & 0 & -\text{SIN}(\theta) \\ 0 & 1 & 0 \\ \text{SIN}(\theta) & 0 & \text{COS}(\theta) \end{pmatrix} \cdot \begin{pmatrix} 1 & 0 & 0 \\ 0 & \text{COS}(\phi) & \text{SIN}(\phi) \\ 0 & -\text{SIN}(\phi) & \text{COS}(\phi) \end{pmatrix}$$

Velocity with Respect to the Earth Axis:

$$\begin{pmatrix} U_W \\ V_W \\ W_W \end{pmatrix} = \begin{pmatrix} U \\ V \\ W \end{pmatrix} \cdot \begin{pmatrix} 1 & 0 & 0 \\ 0 & \text{COS}(\phi) & \text{SIN}(\phi) \\ 0 & -\text{SIN}(\phi) & \text{COS}(\phi) \end{pmatrix} \cdot$$

$$\begin{pmatrix} \text{COS}(\theta) & 0 & -\text{SIN}(\theta) \\ 0 & 1 & 0 \\ \text{SIN}(\theta) & 0 & \text{COS}(\theta) \end{pmatrix} \cdot \begin{pmatrix} \text{COS}(\psi) & \text{SIN}(\psi) & 0 \\ -\text{SIN}(\psi) & \text{COS}(\psi) & 0 \\ 0 & 0 & 1 \end{pmatrix}$$

Position with Respect to the Earth Axis:

$$X_W = X_W + U_W \Delta t$$

$$Y_W = Y_W + V_W \Delta t$$

$$Z_W = Z_W + W_W \Delta t$$

In the above-mentioned equations the values of the normal force coefficient $C_N$ and of the position of the pressure center $X_{CP}, Y_{CP}$ are taken from a suitable aerodynamic model for the case under analysis.

The Body Used to Represent the Debris Shed Off from the Aircraft

Good results were achieved using as representative bodies of the debris shed off the aircraft flat plates of, preferably, square and circular shapes with a size and density determined on the basis of the material of the debris under analysis.

Figure 3:
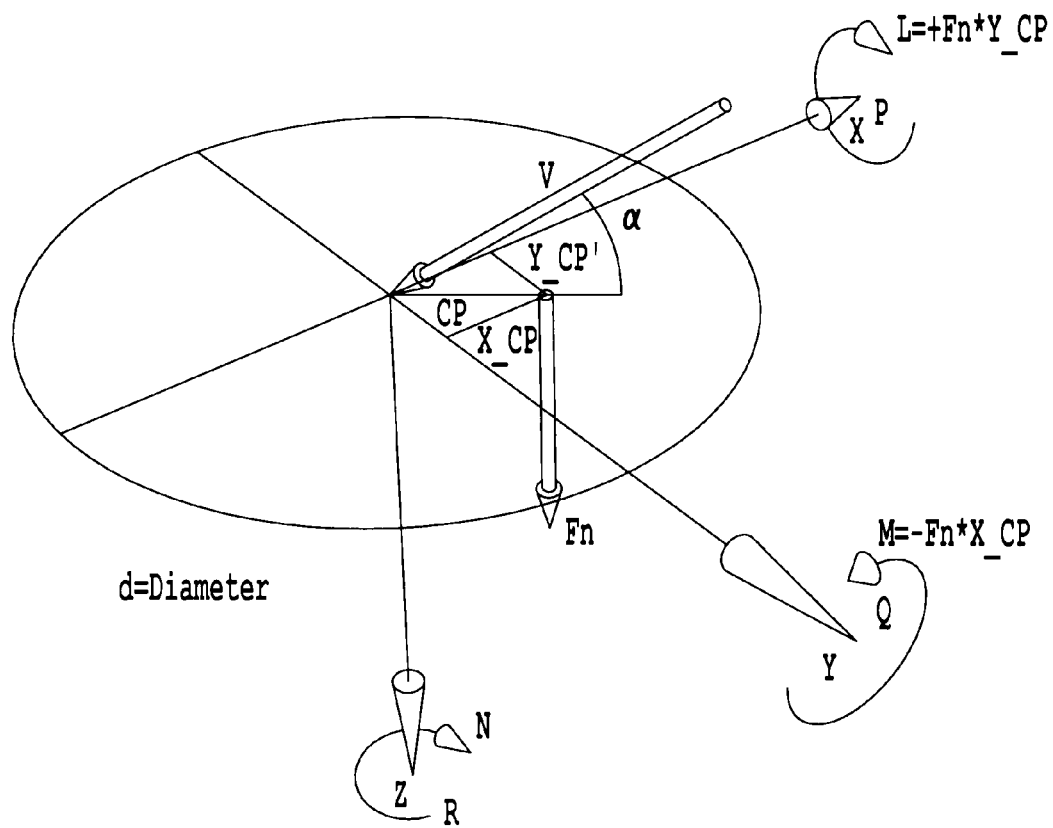
FIGS. 3 to 6 illustrate various aspects of the analytical model for calculating trajectories of flat square plates.
Figure 4:
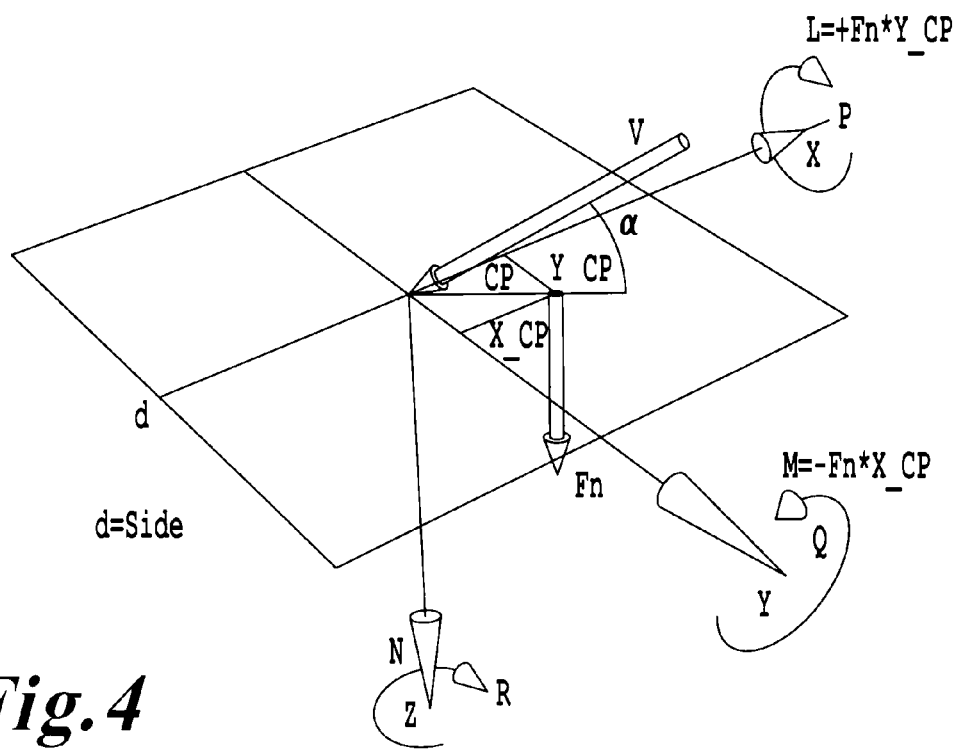

FIGS. 3 and 4 respectively show the momentum equations for, respectively, a circular plate and a square plate.

Figure 5:
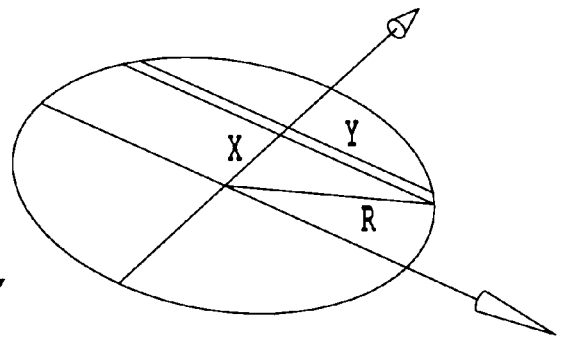

The calculation of the coefficient $C_{DD2}$ of a circular flat plate as the one shown in FIG. 5 is the following:

$$D = \frac{1}{2}C_d\rho V^2 S; \; dD = \frac{1}{2}C_d\rho V^2 dS \; (V = px; dS = 2y \cdot dx)$$

$$\Rightarrow dD = C_d\rho(px)^2 y \cdot dx$$

$M_R = Dx$; $dM_R = dDx$; $dM_R = C_d\rho(px)^2 \, ydx \cdot x$; $dM_R = C_d\rho p^2 x^3 y \cdot x$ Making the change: $y = R\cos\alpha$; $x = R\sin\alpha$; $dx = R\cos\alpha \cdot d\alpha$
$dM_R = C_d\rho \cdot p^2 \cdot R^3 \sin^3\alpha \cdot R^2 \cos^2\alpha \cdot d\alpha$ $$M_R = 2\int_0^{\frac{\pi}{2}} C_d\rho p^2 R^3 \sin^3\alpha \cdot R^2 \cos^2\alpha \cdot d\alpha = C_d\rho p^2 R^5 \frac{4}{15}$$

Calling:

$$C_{DD2} = C_d\rho R^5 \frac{4}{15};$$

$M_R = C_{DD2} p^2$
Dimensions:

$$[M_R] = [F \cdot L] = \left[M\frac{L}{T^2}L\right] = \left[M\frac{L^2}{T^2}\right]$$

$$[C_{DD2}] = \left[\frac{M}{L^3} \cdot L \cdot L^4\right] = [M \cdot L^2]$$

$$[p^2] = \frac{1}{T^2}$$

Figure 6:
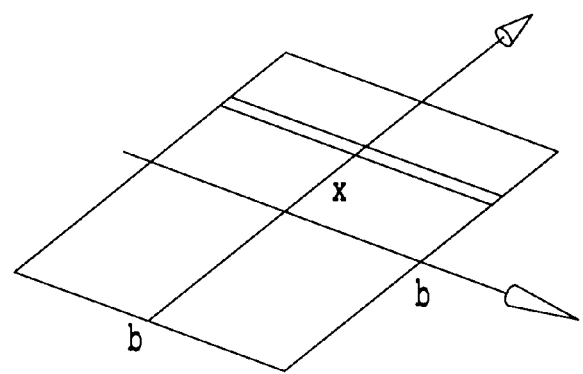

The calculation of the coefficient $C_{DD2}$ of a square flat plate as the one shown in FIG. 6 is the following:

$$D = \frac{1}{2}\rho V^2 C_d S; \; dD = \frac{1}{2}\rho V^2 C_d dS \; (V = px; dS = b \cdot dx)$$

$$\Rightarrow dD = \frac{1}{2}C_d\rho(px)^2 b \cdot dx$$

$M_R = Dx; \; dM_R = dD \cdot x;$ $$dM_R = \frac{1}{2}C_d\rho(px)^2 bdx \cdot x \quad dM_R = \frac{1}{2}C_d\rho p^2 bx^3 \cdot dx$$

$$M_R = 2C_d \int_0^{\frac{b}{2}} \frac{1}{2}\rho p^2 bx^3 \cdot dx = \frac{1}{4}C_d\rho p^2 b\left(\frac{b}{2}\right)^4$$

Calling:

$$C_{DD2} = \frac{1}{4}C_d\rho b\left(\frac{b}{2}\right)^4;$$

$M_R = C_{DD2} p^2$
Dimensions:

$$[M_R] = [F \cdot L] = \left[M\frac{L}{T^2}L\right] = \left[M\frac{L^2}{T^2}\right]$$

$$[C_{DD2}] = \left[\frac{M}{L^3} \cdot L \cdot L^4\right] = [M \cdot L^2]$$

$$[p^2] = \frac{1}{T^2}$$

Two Suitable Aerodynamic Models for Flat Plates are:
ESDU (Ref. ESDU Fluid forces and moments on flat plates. Data item 70015)
Hoerner (Hoerner, S. F. and Borst, H. V., Fluid-Dynamic Lift: Practical Information on Aerodynamic and Hydrodynamic Lift, Hoerner Fluid Dynamics, 1975
The Data and Variables of the Method As we have seen an important aspect of the present invention is the calculation of many trajectories of the debris varying randomly the initial starting conditions following the style of Monte Carlo methods.

In case it would be wanted to analyze, for example, the areas of likely impact on an aircraft of debris representable by a square plate, it could be used as input data:
The density of the plate;
The nominal position of the plate;
The fluid field where the plate moves;
The geometry of the surface of the aircraft.

Regarding the initial conditions to be varied randomly, one or more of the following could be used:
The initial position of the plate within a prefixed space (for example a cube) around the nominal position taken as a data;
The dimensions of the plate within a set of predetermined values;
The damping coefficients used in the analytical model within a set of predetermined values;
The departure angles of the square plate in all three axes (pitch, roll, yaw) within a predetermined range.

Using the above-mentioned analytical model a predetermined number of trajectories (usually very large) are calculated varying randomly the values of said initial conditions.

From these trajectories and the geometry of the aircraft the impact points are calculated and also its speed allowing the analysis of the probability of impacts on different areas of the aircraft and its effects.

As the skilled man will readily understand the former division between data and variables shall not be understood rigidly but established taking into account the particularities of the case under analysis.

For example it could be taken as a data rather than a variable the dimensions of the plate if the debris under analysis has a low probability of rupture and, conversely, the density of the plate might be taken as a variable rather than as data if the debris under analysis could be of a different material (such as a piece of ice or a piece of metal that could detached from a given area of the aircraft).

The Computer Program

The biggest advantage of the method according to the invention, particularly in relation to wind tunnel tests, is the possibility of analyzing the case in question considering different input data and calculating a large number of trajectories in a computationally reasonable time at low costs due to the use of an analytical model.

In that sense, it is important that the implementation of the method in a computer program allows both the graphical representation of the calculated trajectories and an easy calculation of their impacts on the aircraft.

To this end, it is convenient firstly to obtain such trajectories as a collection of points identified by its coordinates so that they can be stored in IGES ("Initial Graphics Exchange Specification") files. Secondly, it is desirable to have the geometry of the aircraft in the form of triangular meshes to calculate and plot the impacts using CAD tools such as CATIA.

Examples of Execution of the Method

Figure 7A:
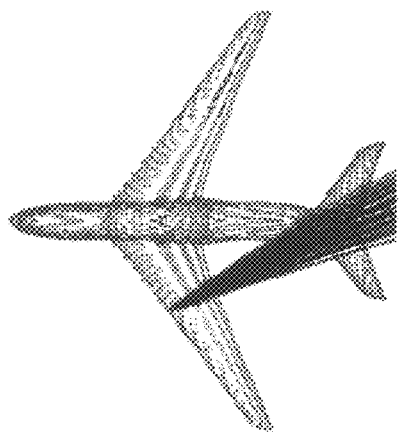
FIGS. 7a and 7b show the results obtained in a first example of execution of the method of the present invention.
Figure 7B:
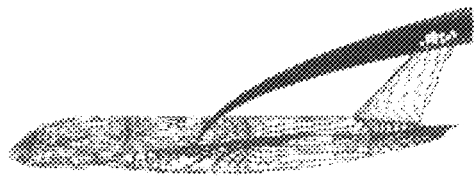

FIGS. 7a and 7b graphically illustrate the results obtained by applying the method of the present invention to predict the impact on an aircraft of a slat shed off from the wing.

The slat was represented by a flat plate of dimensions 0.13 m×0.0325 m×0.02 m and density 59 kg/m'.

The trajectories were calculated randomly varying initial conditions in the following ranges:

Angle of Yaw: From 29° to 43°.
Angle of roll: From 2° to 11°.
Angle Pitch: From 0° to 20°.

The result obtained was a probability of impact on the vertical tail plane of 11.25%.

Figure 8A:
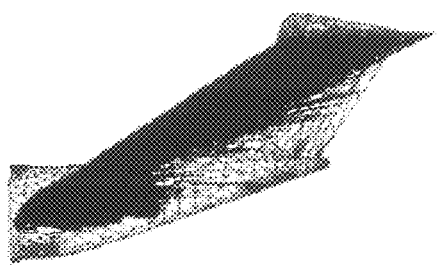
FIGS. 8a and 8b show the results obtained in a second example of execution of the method of the present invention.
Figure 8B:
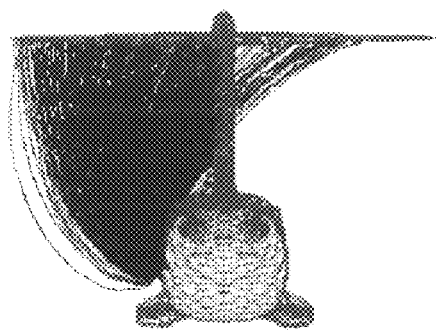

FIGS. 8a and 8b illustrate graphically the results obtained using the method of the present invention to predict the impact on the aircraft of a deflector shed off from the wing.

The deflector was represented by a flat plate of dimensions 1.69 m×0.56 m×0.1 m and density 105.88 kg/m3.

500,000 trajectories were calculated randomly varying the initial conditions in the following ranges:

Yaw angle: +/−90°.
Roll angle: +/−90°.
Pitch angle: +/−90°.

The results obtained were:

Left horizontal tail plane: Probability of impact 0.32%, average impact velocity 135 m/s.

Right horizontal tail plane: Probability of impact 0.032%, average impact velocity 144 m/s.

Vertical tail plane: Probability of impact 0.28%, average impact velocity 133 m/s.

Fuselage: Probability of impact 0.94%, average impact velocity 73 m/s.

Although the present invention has been fully described in connection with preferred embodiments, it is evident that modifications may be introduced within the scope thereof, not considering this as limited by these embodiments, but by the contents of the following claims.

The invention claimed is:

1. A computer-aided method to design an aircraft by predicting a location of an impact on the aircraft of debris of predetermined characteristics shed off from the aircraft, the method comprising:

a) providing a nominal position on the aircraft of said debris before the debris is detached from the aircraft and providing a geometry of a surface of the aircraft;
b) representing the debris by a body of a size and a density appropriate to characteristics of the debris;
c) calculating, by a computer, a predetermined number of trajectories in three dimensions of said body in a predetermined fluid field when the debris is detached from the aircraft using an analytical model for calculating said trajectories, the analytical model comprising equations of motion of said body resulting from aerodynamic forces and moments acting on the body and including one or more damping coefficients of angular velocities of roll, pitch and yaw of the body, and randomly varying one or more of conditions, the predetermined number of the trajectories being calculated with the varied one or more of the conditions using the analytical model until the predetermined number of the trajectories are calculated, the predetermined number of the trajectories being calculated with varied initial positions of the body within a predetermined space around said nominal position on the aircraft using the analytical model until the predetermined number of the trajectories are calculated, the conditions including:

an initial position within the geometry of the body around said nominal position;
dimensions of the body within a first set of predetermined values;
the damping coefficients of the angular velocities of roll, pitch and yaw within a second set of predetermined values; and
initial angles of the body of roll, pitch and yaw within a predetermined range of values;

d) calculating a point of impact and a probability of impact for each of said trajectories to the surface of the aircraft for each of the varied initial positions of the body within the predetermined space around said nominal position on the aircraft; and
e) designing the aircraft based on the calculated point of impact and the probability of impact for each of said trajectories to the surface of the aircraft for each of the varied initial positions of the body within the predetermined space around said nominal position on the aircraft.

2. The computer-aided method according to claim 1, wherein a velocity of the body at a time of the impact is also calculated.

3. The computer-aided method according to any of claims 1-2, wherein the body is a flat plate.

4. The computer-aided method according to claim 3, wherein a normal force coefficient $C_N$ and a position of the pressure centre $X_{CP}, Y_{CP}$ corresponding to said flat plate are taken from a predetermined aerodynamic model.

5. The computer-aided method according to claim 4, wherein said predetermined aerodynamic model is a Hoerner model.

6. The computer-aided method according to claim 1, wherein the predetermined range of the initial angles of the body with respect to any of three coordinate axes is between −90° and +90°.

7. The computer-aided method according to any of claim 1, wherein the fluid field in which occurs the detachment of the debris from the aircraft is a uniform fluid field of a predetermined speed.

8. The computer-aided method according to any of claim 1, wherein the fluid field in which occurs the detachment of the debris from the aircraft is a real fluid field.

9. The computer-aided method according to claim 1, wherein, when calculating the predetermined number of the trajectories, the dimensions of the body are fixed when the debris has a low probability of rupture.

10. The computer-aided method according to claim 1, wherein, when calculating the predetermined number of the trajectories, the density of the body is varied when the debris can be of a different material.

11. A non-transitory computer readable medium including executable instructions, which when executed by a computer cause the computer to execute a method to design an aircraft by predicting a location of an impact on the aircraft of debris of predetermined characteristics shed off from the aircraft, the method comprising:
   a) providing a nominal position on the aircraft of said debris before the debris is detached from the aircraft and providing a geometry of a surface of the aircraft;
   b) representing the debris by a body of a size and a density appropriate to characteristics of the debris;
   c) calculating a predetermined number of trajectories in three dimensions of said body in a predetermined fluid field when the debris is detached from the aircraft using an analytical model for calculating said trajectories, the analytical model comprising equations of motion of said body resulting from aerodynamic forces and moments acting on the body and including one or more damping coefficients of angular velocities of roll, pitch and yaw of the body, and randomly varying one or more of conditions, the predetermined number of the trajectories being calculated with the varied one or more of the conditions using the analytical model until the predetermined number of the trajectories are calculated, the predetermined number of the trajectories being calculated with varied initial positions of the body within a predetermined space around said nominal position on the aircraft using the analytical model until the predetermined number of the trajectories are calculated, the conditions including:
      an initial position within the geometry of the body around said nominal position;
      dimensions of the body within a first set of predetermined values;
      the damping coefficients of the angular velocities of roll, pitch and yaw within a second set of predetermined values; and
      initial angles of the body of roll, pitch and yaw within a predetermined range of values;
   d) calculating a point of impact and a probability of impact for each of said trajectories to the surface of the aircraft for each of the varied initial positions of the body within the predetermined space around said nominal position on the aircraft; and
   e) designing the aircraft based on the calculated point of impact and the probability of impact for each of said trajectories to the surface of the aircraft for each of the varied initial positions of the body within the predetermined space around said nominal position on the aircraft.

12. The non-transitory computer readable medium according to claim 11, wherein each of said trajectories is obtained as a collection of points identified by coordinates of the points.

13. The non-transitory computer readable medium according to claim 12, wherein a surface representation of the aircraft on triangular meshes is used to calculate the points of impact of said trajectories on the aircraft.

* * * * *